US012733532B2

(12) United States Patent
Matsubara et al.

(10) Patent No.: US 12,733,532 B2
(45) Date of Patent: Sep. 8, 2026

(54) METHOD FOR MANUFACTURING SEMICONDUCTOR DEVICE

(71) Applicant: Resonac Corporation, Tokyo (JP)

(72) Inventors: Hiroaki Matsubara, Tokyo (JP); Daisuke Ikeda, Tokyo (JP); Shogo Sobue, Tokyo (JP); Saeko Ogawa, Tokyo (JP)

( * ) Notice: Subject to any disclaimer, the term of this patent is extended or adjusted under 35 U.S.C. 154(b) by 409 days.

(21) Appl. No.: 18/548,351

(22) PCT Filed: Mar. 4, 2022

(86) PCT No.: PCT/JP2022/009364
§ 371 (c)(1),
(2) Date: Aug. 30, 2023

(87) PCT Pub. No.: WO2022/186372
PCT Pub. Date: Sep. 9, 2022

(65) Prior Publication Data

US 2024/0145256 A1 May 2, 2024

(30) Foreign Application Priority Data

Mar. 4, 2021 (WO) .................. PCT/JP2021/008508

(51) Int. Cl.
*H10W 74/01* (2026.01)
*H10P 54/00* (2026.01)
(Continued)

(52) U.S. Cl.
CPC ........... *H10W 74/014* (2026.01); *H10P 54/00* (2026.01); *H10W 74/019* (2026.01); *H10W 70/09* (2026.01); *H10W 72/0198* (2026.01)

(58) Field of Classification Search
CPC ..... H01L 21/561; H01L 21/568; H01L 21/78; H01L 24/19; H01L 24/96; H01L 2224/19;
(Continued)

(56) References Cited

U.S. PATENT DOCUMENTS 7,105,423 B2 * 9/2006 Yamano .................. H01L 24/97 438/460
10,297,471 B2 * 5/2019 Yu ....................... H01L 21/6835
(Continued)

FOREIGN PATENT DOCUMENTS

JP 2018-074115 5/2018
JP 2019-129179 8/2019
(Continued)

OTHER PUBLICATIONS

B. Rogers, C.Scanlan, T.Olson, "Implementation of a Fully Molded Fan-Out Packaging Technology", Deca Technologies, Inc., Nov. 7, 2013.

(Continued)

*Primary Examiner* — Vu A Vu
(74) *Attorney, Agent, or Firm* — SHIPWAY IP

(57) ABSTRACT

A method for manufacturing a semiconductor device includes preparing a plurality of semiconductor elements, preparing a support member, attaching the plurality of semiconductor elements to the support member so that second surfaces of the plurality of semiconductor elements face the support member, encapsulating the plurality of semiconductor elements with an encapsulation material, removing the support member from an encapsulation material layer in which the plurality of semiconductor elements is encapsulated with the encapsulation material, bonding a first protective film to a second surface of the encapsulation material layer located on the second surface side of the plurality of semiconductor elements, and forming a redistribution layer on a first surface of the encapsulation material layer located on the first surface side of the plurality of semiconductor elements after bonding the first protective film to the encapsulation material layer.

18 Claims, 9 Drawing Sheets

(51) Int. Cl.
*H10W 70/09* (2026.01)
*H10W 72/00* (2026.01)

(58) Field of Classification Search
CPC ....... H01L 2224/96; H01L 2221/68327; H01L 2221/6834; H01L 2221/68345; H01L 21/6835; H01L 21/6836; H01L 23/12; H01L 23/3128; H01L 23/3171; H01L 24/02; H01L 21/565; H01L 23/49816; H01L 24/11; H01L 2224/0231; H01L 2224/02333; H01L 2224/02379; H01L 2224/02381; H01L 2224/11001
USPC .......................................................... 438/114
See application file for complete search history.

(56) References Cited

U.S. PATENT DOCUMENTS 10,756,010 B2 * 8/2020 Yu .......................... H01L 24/89
11,211,360 B2 * 12/2021 Huang .............. H01L 23/49816
11,417,606 B2 * 8/2022 Lin .................. H01L 23/49811
2013/0127044 A1 5/2013 Poddar et al.

FOREIGN PATENT DOCUMENTS

| | | |
|---|---|---|
| JP | 7243934 | 3/2023 |
| TW | 201826405 | 7/2018 |
| WO | 2011/114774 | 9/2011 |
| WO | 2018/043008 | 3/2018 |
| WO | 2020/111154 | 6/2020 |

OTHER PUBLICATIONS

International Search Report dated Jun. 1, 2021 for PCT/JP2021/008508.

International Search Report dated May 17, 2022 for PCT/JP2022/009364.

International Preliminary Report on Patentability with Written Opinion dated Sep. 14, 2023 for PCT/JP2021/008508.

International Preliminary Report on Patentability with Written Opinion dated Sep. 14, 2023 for PCT/JP2022/009364.

* cited by examiner

METHOD FOR MANUFACTURING SEMICONDUCTOR DEVICE

CROSS-REFERENCE TO RELATED APPLICATIONS

This application is a 35 U.S.C. § 371 national phase application of PCT/JP2022/009364, filed on Mar. 4, 2022, which claims priority to International Patent Application No. PCT/JP2021/008508, filed on Mar. 4, 2021.

TECHNICAL FIELD

The present disclosure relates to a method for manufacturing a semiconductor device.

BACKGROUND ART

Non-Patent Literature 1 discloses the configuration of a semiconductor device using fan-out package technology and a method for manufacturing the same.

CITATION LIST

Non-Patent Literature

Non-Patent Literature 1: Boyd Rogers and two others, "IMPLEMENTATION OF A FULLY MOLDED FAN-OUT PACKAGING TECHNOLOGY", Deca Technologies, Inc., November 2013

SUMMARY OF INVENTION

Technical Problem

In the fan-out package technology used in the semiconductor device manufacturing method, semiconductor chips (dies) obtained by singulation are arranged and encapsulated on another wafer to form a rearrangement wafer, and then a re-distribution layer (RDL) is formed to manufacture each semiconductor device. However, when manufacturing a semiconductor device by using the fan-out package technology, a semiconductor chip mounted on the semiconductor device may be damaged. If a semiconductor chip is damaged, a semiconductor device including such a semiconductor chip cannot show desired performance. This may lower the reliability of the semiconductor device.

It is an object of the present disclosure to provide a manufacturing method for manufacturing a highly reliable semiconductor device by preventing damage to a semiconductor element.

Solution to Problem

One aspect of the present disclosure relates to a method for manufacturing a semiconductor device. The method for manufacturing a semiconductor device includes, preparing a plurality of semiconductor elements each having a first surface on which a connection terminal is formed and a second surface opposite to the first surface, preparing a support member, attaching the plurality of semiconductor elements to the support member so that the second surfaces of the plurality of semiconductor elements face the support member, encapsulating the plurality of semiconductor elements with an encapsulation material, removing the support member from an encapsulation body in which the plurality of semiconductor elements are encapsulated with the encapsulation material, bonding a first protective film to a second surface of the encapsulation body located on the second surface side of the plurality of semiconductor elements, and forming a re-distribution layer on a first surface of the encapsulation body located on the first surface side of the plurality of semiconductor elements after bonding the first protective film to the encapsulation body.

In this method, after bonding the first protective film to the encapsulation body, the re-distribution layer is formed on the first surface of the encapsulation body located on the first surface side of the plurality of semiconductor elements. That is, the first protective film is provided on the second surface side of the semiconductor elements before the forming of the re-distribution layer. In this case, it is possible to prevent the semiconductor elements or the encapsulation material from being damaged when forming the re-distribution layer. As a result, it is possible to manufacture a highly reliable semiconductor device.

In the manufacturing method described above, it is preferable that the first protective film contains a curable material and a storage elastic modulus of the first protective film at 25° C. after being cured is 300 MPa to 6000 MPa. When the storage elastic modulus of the first protective film that protects the encapsulation body is within this range, it is possible to suppress the warpage of the entire semiconductor package during assembly. Therefore, the re-distribution layer can be formed with high accuracy. In this aspect, the storage elastic modulus of the first protective film at 250° C. after being cured may be 0.1 MPa to 200 MPa. In this case, even if the encapsulation body and the like are affected by heat in the manufacturing process, the warpage of the entire semiconductor package can be suppressed. Therefore, the re-distribution layer can be formed with high accuracy.

In the manufacturing method described above, it is preferable that the first protective film contains a curable material, in the bonding of the first protective film, the first protective film bonded to the second surface of the encapsulation body is cured, and an adhesion strength between the cured first protective film and the encapsulation body is 1.0 MPa or more. In this case, by firmly bonding the first protective film and the encapsulation body to each other, the first protective film is prevented from peeling off during the manufacturing process. As a result, it is possible to protect the semiconductor element more reliably. In addition, since the first protective film is firmly bonded to the encapsulation body, it is possible to form a re-distribution layer and the like more reliably and accurately.

In the manufacturing method described above, it is preferable that the first protective film contains a curable material, in the bonding of the first protective film, the first protective film bonded to the second surface of the encapsulation body is cured, and an adhesion strength between the cured first protective film and the plurality of semiconductor elements is 1.0 MPa or more. In this case, by firmly bonding the first protective film and the plurality of semiconductor elements to each other, the first protective film is prevented from peeling off during the manufacturing process. As a result, it is possible to protect the semiconductor element more reliably.

The manufacturing method described above may further include removing the first protective film after the forming of the re-distribution layer. In this case, the first protective film, which protects the semiconductor elements and the encapsulation material and is damaged instead in the process of manufacturing the semiconductor device, cannot be included in the final product.

The manufacturing method described above may further include forming a solder ball in the re-distribution layer, and the protective film may be removed after the forming of the solder ball. In this case, in the process of manufacturing a semiconductor device, the semiconductor elements are protected by the first protective film until later steps. As a result, it is possible to manufacture a more reliable semiconductor device. In addition, such a first protective film cannot be included in the final product.

In the manufacturing method described above, the protective film may contain an epoxy resin, and in the removing of the first protective film, the first protective film may be scraped off. By using the epoxy resin for the first protective film, it is possible to protect the semiconductor elements and the encapsulation material from chemicals used in the manufacturing process or the like in addition to protecting the semiconductor elements and the encapsulation material from impact.

The manufacturing method may further include removing the first protective film and bonding a second protective film to the second surface of the encapsulation body in which the re-distribution is formed. In this case, it is possible to provide the second protective film after forming the re-distribution layer and use the protective film as it is as a protective film of the semiconductor device to be manufactured. As a result, it is possible to manufacture a semiconductor device that can protect the semiconductor element even after being manufactured as a product.

In the manufacturing method described above, it is preferable that the second protective film contains a curable material and a storage elastic modulus of the second protective film at 25° C. after being cured is 300 MPa to 6000 MPa. When the storage elastic modulus of the second protective film that protects the plurality of semiconductor elements is within this range, it is possible to suppress the warpage of the entire semiconductor package by increasing the rigidity of the package. As a result, singulation and the like can be performed with high accuracy. In addition, since it is possible to more reliably protect the semiconductor element in each semiconductor device after singulation, a highly reliable semiconductor device can be obtained. In addition, in this aspect, the storage elastic modulus of the second protective film at 250° C. after being cured may be 0.1 MPa to 200 MPa. In this case, even if the encapsulation body and the like are affected by heat in the manufacturing process, it is possible to perform singulation and the like with high accuracy. In addition, since the semiconductor element can be protected more reliably even if each semiconductor device after singulation is affected by heat, a highly reliable semiconductor device can be obtained.

In the manufacturing method described above, it is preferable that, the second protective film contains a curable material, in the bonding of the second protective film, the second protective film bonded to the second surface of the encapsulation body is cured, and an adhesion strength between the cured second protective film and the encapsulation body is 1.0 MPa or more. In this case, since the second protective film and the encapsulation body are firmly bonded to each other, the second protective film is prevented from peeling off during singulation or the like. As a result, it is possible to obtain a semiconductor device having a semiconductor element appropriately protected by the second protective film. In addition, due to such firm bonding, the semiconductor element in the manufactured semiconductor device can be reliably protected by the second protective film. In this aspect, it is more preferable that an adhesion strength between the cured second protective film and the encapsulation body is 7.0 MPa or more. Therefore, since the semiconductor element is more reliably protected by the second protective film, a highly reliable semiconductor device can be obtained.

In the manufacturing method described above, it is preferable that the second protective film contains a curable material, in the bonding of the second protective film, the second protective film bonded to the second surface of the encapsulation body is cured, and an adhesion strength between the cured second protective film and the plurality of semiconductor elements is 1.0 MPa or more. In this case, since the second protective film and the plurality of semiconductor elements are firmly bonded to each other, the second protective film is prevented from peeling off during singulation or the like. As a result, it is possible to obtain a semiconductor device having a semiconductor element appropriately protected by the second protective film. In addition, due to such firm bonding, the semiconductor element in the manufactured semiconductor device can be reliably protected by the second protective film. In this aspect, it is more preferable that an adhesion strength between the cured second protective film and the plurality of semiconductor elements is 7.0 MPa or more. Therefore, since the semiconductor element is more reliably protected by the second protective film, a highly reliable semiconductor device can be obtained.

The manufacturing method described above may further include singulating into individual semiconductor devices corresponding to the plurality of semiconductor elements after bonding the second protective film to the second surface of the encapsulation body. Therefore, a semiconductor device including the second protective film can be easily obtained.

In the manufacturing method described above, the first protective film and the second protective film may be formed as the same type of protective films. In this case, it becomes easier to manage the protective film in the manufacturing process.

Advantageous Effects of Invention

According to one aspect of the present disclosure, it is possible to provide a highly reliable semiconductor device by preventing a semiconductor element or an encapsulation material from being damaged during the manufacture of the semiconductor device.

DESCRIPTION OF EMBODIMENTS

Figure 1:
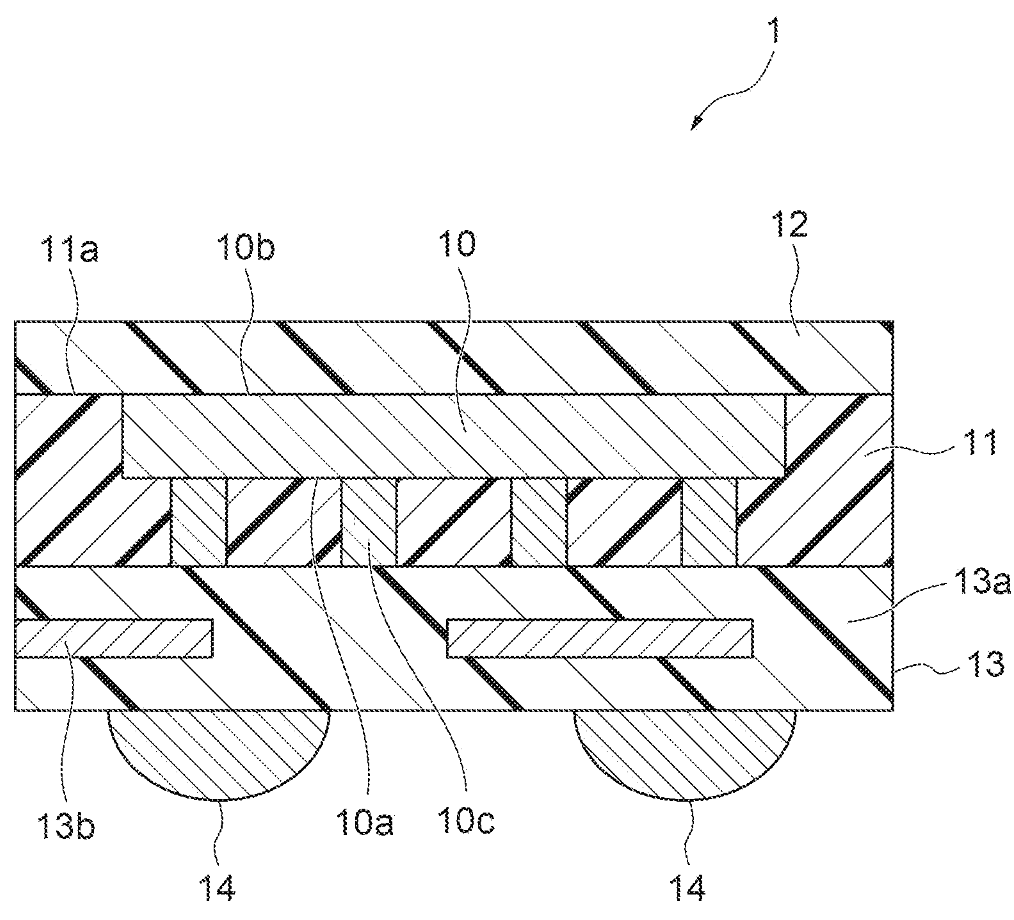
FIG. 1 is a cross-sectional view showing an example of a semiconductor device manufactured by using a method according to an embodiment of the present disclosure.

Hereinafter, several embodiments of the present disclosure will be described in detail with reference to the diagrams as necessary. However, the present disclosure is not limited to the following embodiments. In the following description, the same or equivalent portions are denoted by the same reference numerals, and repeated descriptions thereof may be omitted. It is assumed that the positional relationship such as up, down, left, and right is based on the positional relationship shown in the diagrams unless otherwise specified. The dimensional ratio of each diagram is not limited to the ratio shown in the diagram.

In this specification, the term "layer" includes not only a structure having a shape formed on the entire surface but also a structure having a shape partially formed when observed as a plan view. In this specification, the term "step" includes not only an independent step but also a step whose intended action is achieved even if the step cannot be clearly distinguished from other steps.

In this specification, the numerical range indicated by using "to" indicates a range including the numerical values before and after "to" as the minimum and maximum values, respectively. In the numerical ranges described stepwise in this specification, the upper limit value or lower limit value of the numerical range at one stage may be replaced with the upper limit value or lower limit value of the numerical range at another stage. In the numerical ranges described in this specification, the upper limit value or lower limit value of each numerical range may be replaced with the values shown in the Examples.

Configuration of Semiconductor Device

FIG. 1 is a cross-sectional view schematically showing an example of a semiconductor device manufactured by using a manufacturing method according to the present embodiment. As shown in FIG. 1, a semiconductor device 1 is, for example, a device having a fan-out structure, and includes a semiconductor element 10, an encapsulation material layer 11, a protective layer 12, a re-distribution layer 13, and solder balls 14. The semiconductor device 1 is manufactured by using, for example, fan-out package (FO-PKG) technology. The semiconductor device 1 may be manufactured by using, for example, fan-out wafer level package (FO-WLP) technology or fan-out panel level package (FO-PLP) technology.

The encapsulation material layer 11 is a layer in which the semiconductor element 10 is encapsulated with an encapsulation material such as resin. The protective layer 12 is a cured layer arranged on a second surface 10*b* of the semiconductor element 10 and a surface 11*a* of the encapsulation material layer 11, and is formed by curing a BSC film 34, which will be described later. The re-distribution layer 13 is a layer for increasing the terminal pitch between connection terminals 10*c* of the semiconductor element 10 on the side of a first surface 10*a*, and is formed by, for example, an insulating portion 13*a* such as polyimide and a wiring portion 13*b* such as copper wiring. The solder balls 14 are connected to the terminals between which the terminal pitch is increased by the re-distribution layer 13. Therefore, the connection terminals 10*c* of the semiconductor element 10 are connected to the solder balls 14 with the changed (increased) pitch therebetween.

Method for Manufacturing Semiconductor Device

Next, a method for manufacturing the semiconductor device 1 will be described with reference to FIGS. 2A to 2E to FIGS. 5A to 5D. FIGS. 2A to 2E to FIGS. 5A to 5D are diagrams sequentially showing the method for manufacturing the semiconductor device 1. In this method for manufacturing a semiconductor device, a method for manufacturing a semiconductor device having a fan-out structure (face up, without a support plate) will be described in order.

Figure 2A:
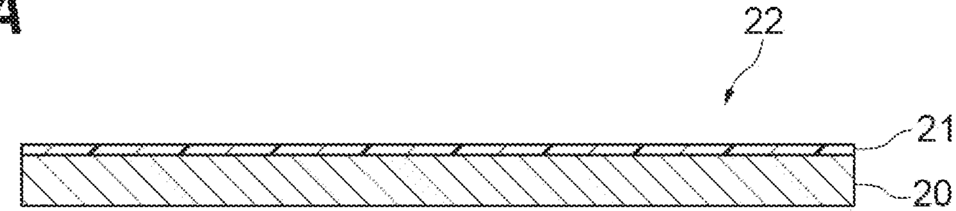
FIGS. 2A to 2E are diagrams showing a part of a method for manufacturing the semiconductor device shown in FIG. 1.
Figure 2B:
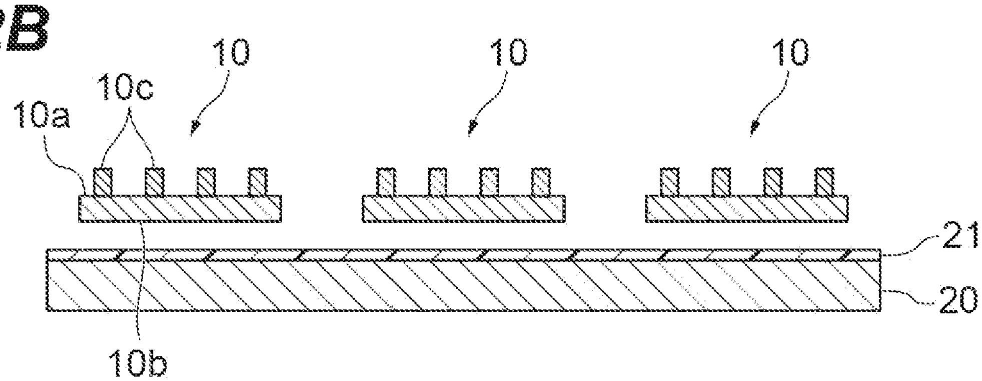

First, a plurality of semiconductor elements 10 each having the first surface 10*a* on which the connection terminals 10*c* are formed and the second surface 10*b* located opposite to the first surface 10*a* are prepared (FIGS. 1 and 2B). A plurality of semiconductor elements 10 are collectively formed, for example, by a general semiconductor process and then singulated by dicing, thereby manufacturing each semiconductor element 10. Since a conventional method can be used for this manufacturing process, description thereof is omitted.

In addition, as shown in FIG. 2A, in this method for manufacturing a semiconductor device, an adhesive layer 21 is provided on a carrier 20 formed of metal. As a result, a support member 22 for supporting the plurality of semiconductor elements 10 is formed (prepared). The thickness of the carrier 20 is, for example, 0.1 mm or more and 2.0 mm or less. The thickness of the carrier 20 is not limited to this. In addition, the carrier 20 may have a disc-like wafer shape in plan view, or may have a rectangular panel shape. As the adhesive layer 21, for example, a release sheet (for example, manufactured by Nitto Denko Corporation, product name: Rivalpha (registered trademark)) that has adhesive force at room temperature but loses adhesive force when heated, can be used. The adhesive layer 21 is formed of, for example, an acrylic pressure-sensitive adhesive.

Figure 2C:
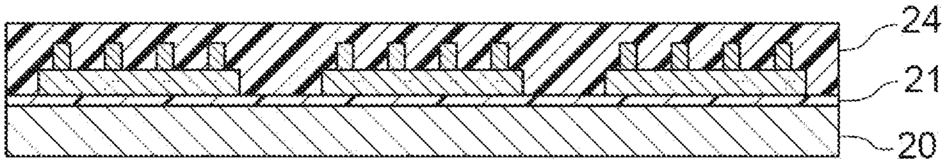

Then, when the preparation of the support member 22 is completed, as shown in FIG. 2B, a plurality of semiconductor elements 10 are arranged on the adhesive layer 21 so that the second surfaces 10*b* of the plurality of semiconductor elements 10 face the adhesive layer 21 (that is, face up). Thereafter, when the plurality of semiconductor elements 10 are arranged on the support member 22, as shown in FIG. 2C, the plurality of semiconductor elements 10 are encapsulated with an encapsulating resin (encapsulation material), such as an epoxy resin, to form an encapsulation material layer 24 (encapsulation body). As a result, the plurality of semiconductor elements 10 are entirely covered with the encapsulating resin and included in the encapsulation material layer 24. The material for encapsulating the semiconductor element 10 may be an insulating resin other than the epoxy resin.

Figure 2D:
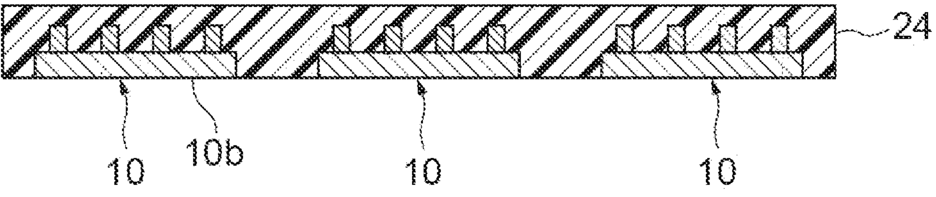

Then, when the encapsulating is completed, as shown in FIG. 2D, the adhesive layer 21 and the like are heated to peel off the adhesive layer 21 from the semiconductor element 10, thereby removing the carrier 20. At this time, the second surfaces 10*b* of the semiconductor elements 10 are exposed from the encapsulation material layer 24.

Figure 2E:

Then, as shown in FIG. 2E, a protective film 26 (first protective film) is bonded to the surface (second surface) of the encapsulation material layer 24 where the semiconductor elements 10 are exposed. The protective film 26 is called, for example, a back side coat (BSC) or the like, and is a film for protecting the exposed surfaces of the semiconductor elements 10 and the encapsulation material layer 24 from chemical contamination or the application of external force in subsequent steps. This protective film is formed of, for example, an epoxy resin. The protective film 26 may be curable or may be non-curable. When the protective film 26 is curable, the protective film 26 may be either thermosetting or energy ray curable. After the protective film 26 is bonded, the protective film 26 is cured by either heat or energy rays to become a cured film. When the protective film 26 is a non-curable protective film, for example, a non-curable protective film-forming composition containing a polymer component such as acrylic polymer, polyimide, polyamide, and silicone polymer can be used. When the protective film 26 is a thermosetting protective film, the protective film 26 may contain at least a compound having a functional group that reacts with heating. For example, it is possible to use a thermosetting protective film-forming composition containing a polymerizable monomer having a reactive group such as a hydroxyl group, a carboxyl group, an epoxy group, and an amino group (reactive group-containing polymerizable monomer), a polymer of the reactive group-containing polymerizable monomer, or a thermosetting resin such as an epoxy resin or a phenol resin. In addition, when the protective film 26 is an energy ray curable protective film, the protective film 26 may contain at least a compound having a functional group that reacts with emission of energy rays. It is possible to use an energy ray curable protective film-forming composition containing a reactive group-containing polymerizable monomer such as an acrylic monomer, a polymer of the reactive group-containing polymerizable monomer, or an energy ray curable resin such as an epoxy resin. These protective film-forming compositions may be used alone or in combination of two or more. In addition, the protective film-forming compositions can be used in combination with a substrate such as a polyimide film.

When the protective film 26 is a thermosetting or energy ray curable material, the storage elastic modulus of the protective film 26 at 25° C. after being cured may be 300 MPa to 6000 MPa. When the storage elastic modulus of the protective film 26 that protects the encapsulation material layer 24 is within this range, it is possible to suppress the warpage of the entire semiconductor package during assembly by increasing the rigidity of the package. As a result, a re-distribution layer 28, which will be described, can be formed with high accuracy. In addition, the storage elastic modulus of the protective film 26 at 250° C. after being cured may be 0.1 MPa to 200 MPa. In this case, even if the encapsulation material layer 24 and the like are affected by heat in the manufacturing process, the warpage of the entire semiconductor package can be suppressed. Therefore, the re-distribution layer 28 can be formed with high accuracy.

In addition, when the protective film 26 is a thermosetting or energy ray curable material, the protective film 26 may be formed of a curable material that makes the adhesion strength between the cured protective film 26 and each of the encapsulation material layer 24 and the semiconductor element 10 be equal to or greater than 1.0 MPa. By firmly bonding the protective film 26 and the encapsulation material layer 24 or the semiconductor elements 10 to each other in this manner, the protective film 26 is prevented from peeling off during the manufacturing process. As a result, it is possible to protect the semiconductor elements 10 or the encapsulation material layer 24 more reliably. In addition, since the protective film 26 is firmly bonded to the encapsulation material layer 24 or the semiconductor elements 10, it is possible to form the re-distribution layer 28 and the like more reliably and accurately. The protective film 26 may be formed of a curable material that makes the adhesion strength between the cured protective film 26 and each of the encapsulation material layer 24 and the semiconductor elements 10 be equal to or greater than 7.0 MPa, or may be formed of a curable material that makes the adhesion strength between the cured protective film 26 and each of the encapsulation material layer 24 and the semiconductor elements 10 be equal to or greater than 10 MPa. All of the adhesion strengths described above are adhesion strengths at room temperature (25° C.), but the same is true for the adhesion strengths at high temperatures (for example, 250° C.).

Figure 3A:
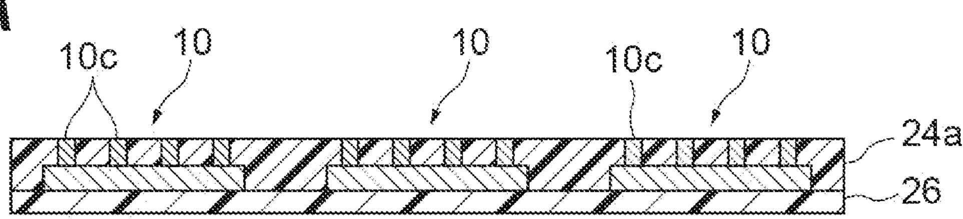
FIGS. 3A to 3D are diagrams showing steps of the method for manufacturing the semiconductor device shown in FIG. 1, which are performed subsequent to the steps in FIGS. 2A to 2E.

Then, when the semiconductor element 10 is encapsulated with the encapsulating resin and protected by the protective film 26, as shown in FIG. 3A, the encapsulation material layer 24 on the protective film 26 is polished until the connection terminals 10*c* of the semiconductor elements 10 are exposed, thereby forming an encapsulation material layer 24*a*. In this polishing step, for example, the encapsulation material layer 24 is polished to such an extent that the connection terminals 10*c* arranged on the first surface 10*a* side of the semiconductor elements 10 are exposed to the outside from the encapsulating resin. As a result, the connection terminals 10*c* of the semiconductor elements 10 are exposed from the top surface of the polished encapsulation material layer 24*a* and can be connected. During this polishing step, since the second surface 10*b* side of the semiconductor elements 10 is covered with the protective film 26, the semiconductor elements 10 and the surface (lower surface in the diagram) of the encapsulation material layer 24*a* opposite to its top surface are prevented from being damaged.

Figure 3B:
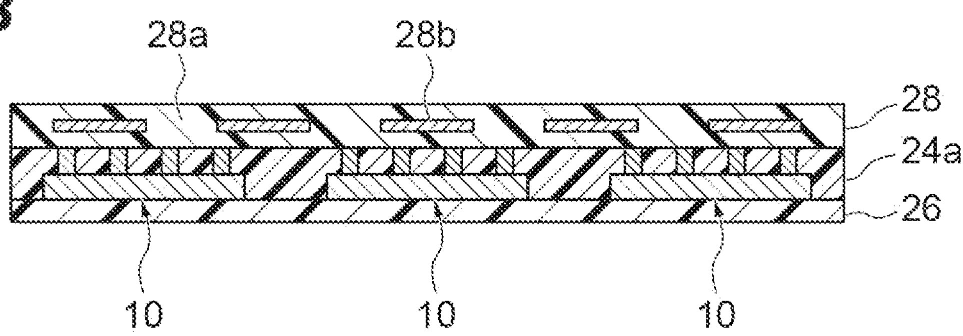

Then, when the polishing of the encapsulation material layer is completed, as shown in FIG. 3B, the re-distribution layer 28 is formed on the first surfaces 10*a* of the plurality of semiconductor elements 10 in a state in which the plurality of semiconductor elements 10 are fixed on the protective film 26. The re-distribution layer 28 is a portion corresponding to the re-distribution layer 13 of the semiconductor device 1 described above, and includes an insulating layer portion 28*a* such as polyimide and a wiring portion 28*b* such as copper wiring in the insulating layer portion 28*a*. In the step of forming the re-distribution layer 28, the formation of an insulating layer and the formation of a wiring portion are repeated a predetermined number of times to form a wiring layer for pitch conversion. In this step, since the semiconductor elements 10 are protected by being covered with the encapsulation material layer 24*a* and the protective film 26, the semiconductor elements 10 are prevented from being damaged when constructing a fine re-distribution layer. In addition, since the protective film 26 has high rigidity, it is possible to form the re-distribution layer 28 without warpage or the like.

Figure 3C:
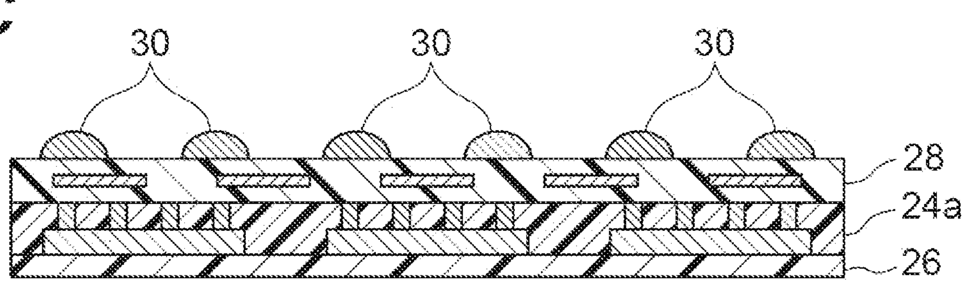

Then, when the re-distribution layer is formed, as shown in FIG. 3C, solder balls 30 are formed in a state in which the plurality of semiconductor elements 10 are fixed on the protective film 26 so that the connection terminals 10*c* of the plurality of semiconductor elements 10 are connected to the solder balls 30 through the re-distribution layer 28. At this time, the solder balls 30 are formed so that the pitch between the solder balls 30 is larger than the terminal pitch between the connection terminals 10*c* of the semiconductor element 10. The solder balls 30 correspond to the solder balls 14 in the semiconductor device 1 described above.

Figure 3D:
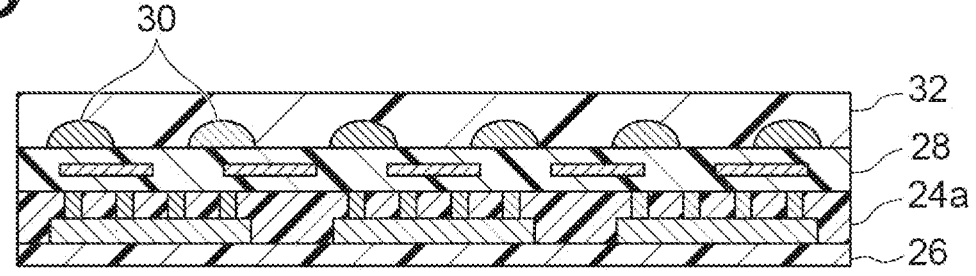
Figure 4A:
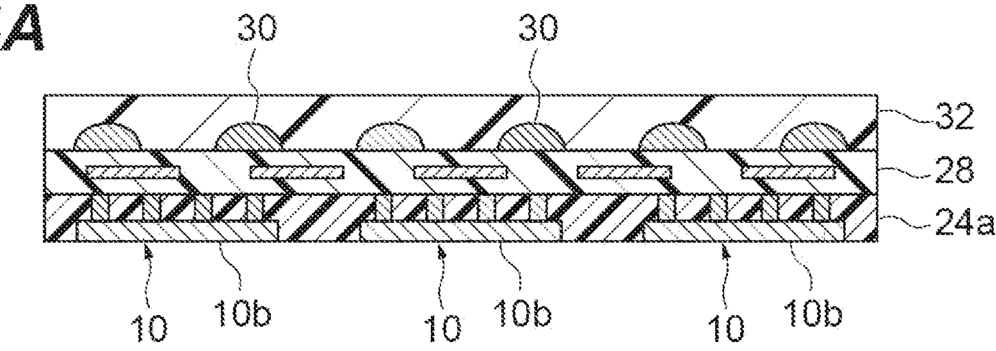
FIGS. 4A to 4D are diagrams showing steps of the method for manufacturing the semiconductor device shown in FIG. 1, which are performed subsequent to the steps in FIGS. 3A to 3D.

Then, when the solder balls 30 are formed, as shown in FIG. 3D, a protective tape 32 (BG tape) for protecting the solder balls 30 is further bonded. The protective tape 32 is formed of polyolefin, for example. Then, as shown in FIG. 4A, the protective film 26 is scraped off in a state in which the solder balls 30 are protected by the protective tape 32. At this time, parts of the semiconductor elements 10 on the second surface 10*b* side may be removed to reduce the thickness. This scraping processing can be performed by using, for example, a surface grinder (for example, a surface grinder manufactured by DISCO Corporation).

Figure 4B:
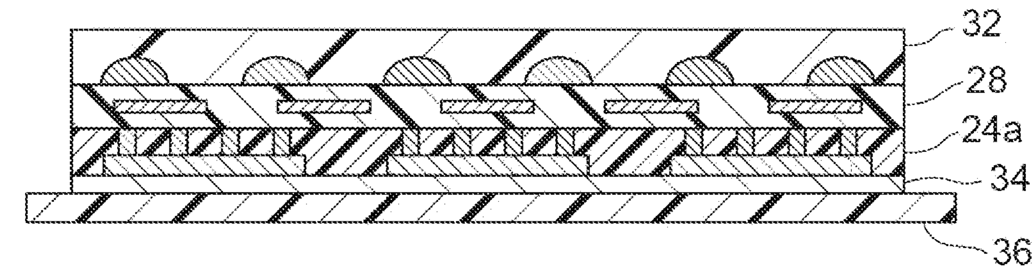
Figure 4C:
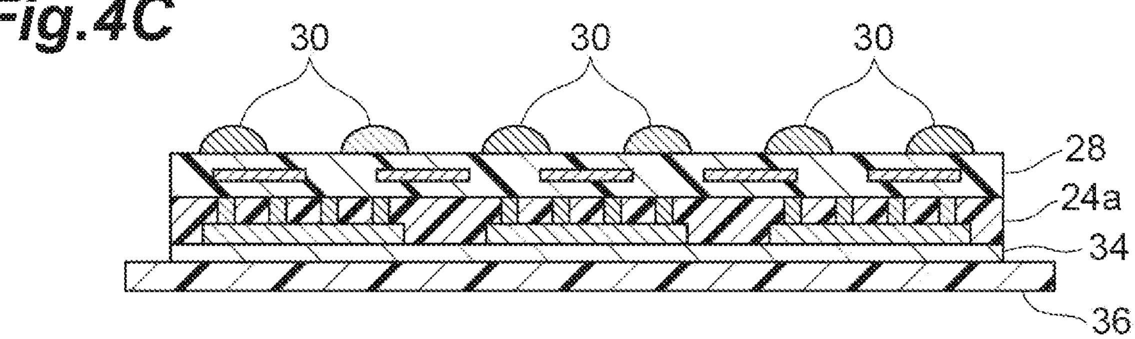
Figure 4D:
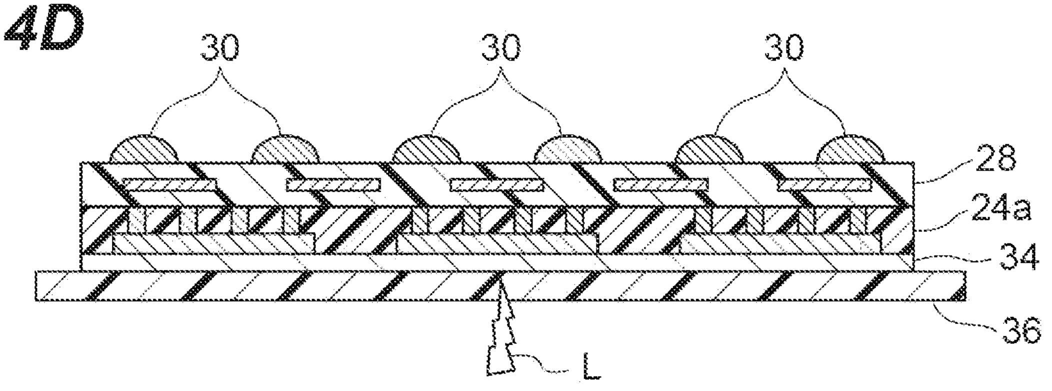

Thereafter, as shown in FIGS. 4B and 4C, a dicing tape 36 is bonded through the BSC film 34 (second protective film), and the protective tape 32 is removed in this state. The BSC film 34 is formed of, for example, an epoxy resin. Then, when the removal of the protective tape 32 is completed, as shown in FIG. 4D, laser marking is performed on the BSC film 34 with a laser beam L to write necessary information such as the product name. The BSC film 34 may be an energy ray curable protective film or may be cured by laser or the like. The BSC film 34 forms a part (protective layer 12) of the semiconductor device.

The BSC film 34 is called, for example, a backside coat (BSC) or the like, and functions as a member for fixing the dicing tape 36 to the encapsulation material layer 24*a* and the semiconductor elements 10 in the manufacturing process. The BSC film 34 becomes the protective layer 12 after the semiconductor device 1 shown in FIG. 1 is manufactured, and protects the semiconductor element 10 in the semiconductor device 1. Such a BSC film 34 may be formed by using the same type of protective film as the protective film 26 described above. For example, the BSC film 34 is formed of an epoxy resin. Since the BSC film 34 is formed of the same material as the protective film 26, it becomes easier to manage the protective film in the manufacturing process. The BSC film 34 may be curable or may be non-curable. When the BSC film 34 is curable, the BSC film 34 may be either thermosetting or energy ray curable. After the BSC film 34 is bonded, the BSC film 34 is cured by either heat or energy rays to become a cured film. When the BSC film 34 is a non-curable protective film, for example, a non-curable protective film-forming composition containing a polymer component such as acrylic polymer, polyimide, polyamide, and silicone polymer can be used. When the BSC film 34 is a thermosetting protective film, the BSC film 34 may contain at least a compound having a functional group that reacts with heating. For example, it is possible to use a thermosetting protective film-forming composition containing a polymerizable monomer having a reactive group such as a hydroxyl group, a carboxyl group, an epoxy group, and an amino group (reactive group-containing polymerizable monomer), a polymer of the reactive group-containing polymerizable monomer, or a thermosetting resin such as an epoxy resin or a phenol resin. Furthermore, when the BSC film 34 is an energy ray curable protective film, it may contain at least a compound having a functional group that reacts when irradiated with an energy ray. A reactive group-containing polymerizable monomer such as an acrylic monomer, a polymer of the reactive group-containing polymerizable monomer or an energy ray curable protective film-forming composition containing an energy ray curable resin such as an epoxy resin can be used. These protective film-forming compositions may be used alone or in combination of two or more. In addition, the protective film-forming compositions can be used in combination with a substrate such as a polyimide film. The BSC film 34 may be formed of a material different from that of the protective film 26.

When the BSC film 34 is a thermosetting or energy ray curable material, the storage elastic modulus of the BSC film 34 at 25° C. after being cured may be 300 MPa to 6000 MPa. When the storage elastic modulus of the BSC film 34 that protects the encapsulation material layer 24*a* is within this range, it is possible to suppress the warpage of the entire semiconductor package by increasing the rigidity of the package. As a result, singulation and the like, which will be described, can be performed with high accuracy. In addition, since it is possible to more reliably protect the semiconductor element 10 in each semiconductor device 1 after singulation, a highly reliable semiconductor device can be obtained. In addition, the storage elastic modulus of the BSC film 34 at 250° C. after being cured may be 0.1 MPa to 200 MPa. In this case, even if the encapsulation material layer 24*a* and the like are affected by heat in the manufacturing process, it is possible to perform singulation and the like with high accuracy. In addition, since the semiconductor element 10 can be protected more reliably even if each semiconductor device 1 after singulation is affected by heat, a highly reliable semiconductor device can be obtained.

In addition, when the BSC film 34 is a thermosetting or energy ray curable material, the BSC film 34 may be formed of a curable material that makes the adhesion strength between the BSC film 34 cured after bonding and each of the encapsulation material layer 24*a* and the plurality of semiconductor elements 10 (for example, silicon chips) be equal to or greater than 1.0 MPa. By firmly bonding the BSC film 34 and each of the encapsulation material layer 24*a* and the semiconductor elements 10 to each other in this manner, the BSC film 34 is prevented from peeling off during singulation or the like. As a result, it is possible to obtain the semiconductor device 1 having the semiconductor element 10 appropriately protected by the BSC film 34 (protective layer 12). In addition, due to such firm bonding, the semiconductor element 10 in the manufactured semiconductor device 1 can be reliably protected by the BSC film 34. The BSC film 34 may be formed of a curable material that makes the adhesion strength between the cured BSC film 34 and each of the encapsulation material layer 24*a* and the plurality of semiconductor elements 10 be equal to or greater than 7.0 MPa, or may be formed of a curable material that makes the adhesion strength between the cured BSC film 34 and each of the encapsulation material layer 24*a* and the plurality of semiconductor elements 10 be equal to or greater than 10 MPa. Therefore, since the semiconductor elements 10 are more reliably protected by the BSC film 34, a highly reliable semiconductor device can be obtained. All of the adhesion strengths described above are adhesion strengths at room temperature (25° C.), but the same is true for the adhesion strengths at high temperatures (for example, 250° C.).

Figure 5A:
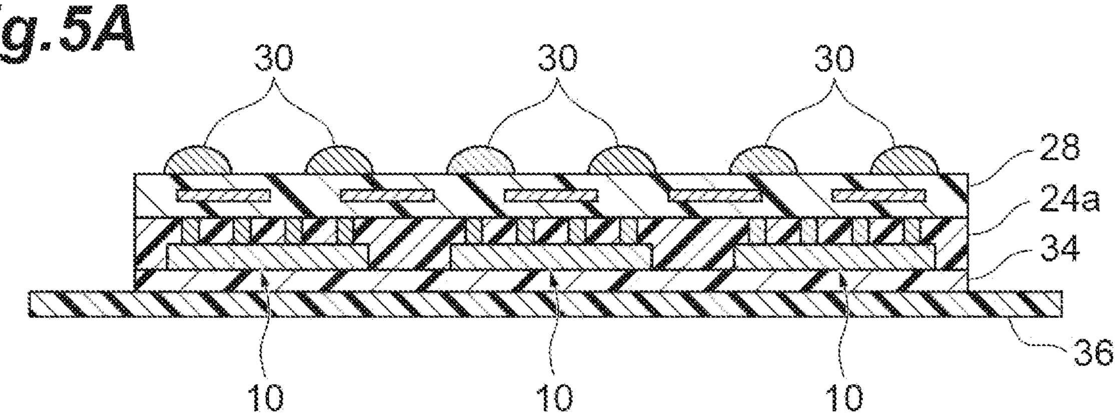
FIGS. 5A to 5D are diagrams showing steps of the method for manufacturing the semiconductor device shown in FIG. 1, which are performed subsequent to the steps in FIGS. 4A to 4D.
Figure 5B:
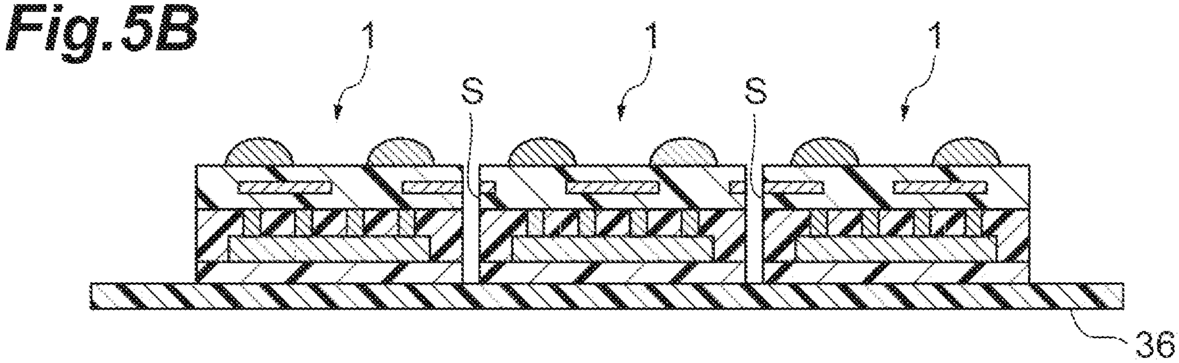
Figure 5C:
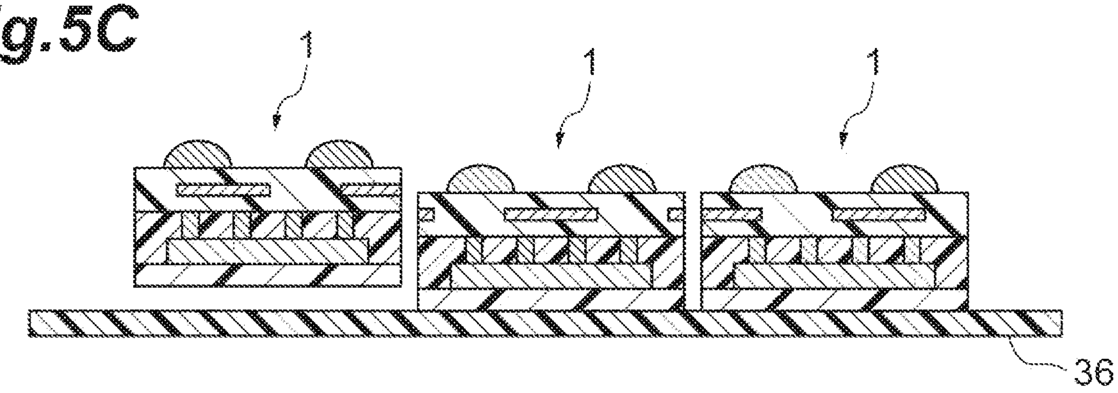
Figure 5D:
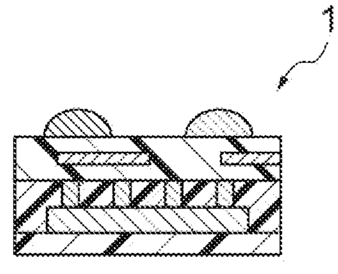

Then, when the laser marking on the BSC film 34 is completed, as shown in FIGS. 5B and 5C, the wafer-shaped or panel-shaped die rearrangement body shown in FIG. 5A is diced at predetermined points S. At this time, the BSC film 34 is cut together with the encapsulation material layer 24*a*. Since the BSC film 34 is firmly bonded to the encapsulation material layer 24*a*, the BSC film 34 does not peel off or shift. Then, respective portions each including the semiconductor element 10 are singulated to obtain each semiconductor device 1. As a result, the plurality of semiconductor devices 1 shown in FIGS. 1 and 5D can be obtained from the die rearrangement body in which the plurality of semiconductor elements 10 are rearranged.

As described above, according to the method for manufacturing a semiconductor device according to the present embodiment, the re-distribution layer 28 is formed on the first surface of the encapsulation material layer 24 (24*a*) located on the first surface 10*a* side of the plurality of semiconductor elements 10 after bonding the protective film 26 to the encapsulation material layer 24. That is, the protective film 26 is provided on the second surface 10*b* side of the semiconductor elements 10 before the step of forming the re-distribution layer 28. Therefore, according to this method, it is possible to prevent the semiconductor elements 10 and the encapsulation material layer 24 from being damaged when forming the re-distribution layer 28. As a result, it is possible to manufacture the highly reliable semiconductor device 1.

In addition, in the manufacturing method according to the present embodiment, the protective film 26 may contain a curable material, and the storage elastic modulus of the protective film 26 at 25° C. after being cured may be 300 MPa to 6000 MPa. In this case, since the warpage of the entire semiconductor package during assembly can be suppressed, the re-distribution layer 28 can be formed with high accuracy. In addition, the storage elastic modulus of the protective film 26 at 250° C. after being cured may be 0.1 MPa to 200 MPa. In this case, even if the encapsulation material layer 24 and the like are affected by heat in the manufacturing process, the warpage of the entire semiconductor package can be suppressed. Therefore, the re-distribution layer 28 can be formed with high accuracy.

In addition, in the manufacturing method according to the present embodiment, the protective film 26 may contain a curable material. In the step of bonding the protective film 26, the protective film 26 bonded to the encapsulation material layer 24 may be cured, and the adhesion strength between the cured protective film 26 and each of the encapsulation material layer 24 and the semiconductor elements 10 may be 1.0 MPa or more. In this case, by firmly bonding the protective film 26 and each of the encapsulation material layer 24 and the semiconductor elements 10 to each other, the protective film 26 is prevented from peeling off during the manufacturing process. As a result, it is possible to protect the semiconductor elements 10 more reliably. In addition, since the protective film 26 is firmly bonded to the encapsulation material layer 24 and the semiconductor elements 10, it is possible to form the re-distribution layer 28 and the like more reliably and accurately.

In addition, the manufacturing method according to the present embodiment further includes a step of removing the protective film 26 after the step of forming the re-distribution layer 28. Therefore, the protective film 26, which protects the semiconductor elements 10 and the encapsulation material layer 24 and is damaged instead in the process of manufacturing the semiconductor device 1, cannot be included in the final product.

In addition, the manufacturing method according to the present embodiment further includes a step of forming the solder balls 30 on the re-distribution layer 28, and further includes a step of removing the protective film 26 after the step of forming the solder balls 30. Therefore, in the process of manufacturing the semiconductor device 1, the semiconductor elements 10 and the encapsulation material layer 24 are protected by the protective film 26 until later steps. As a result, it is possible to manufacture the more reliable semiconductor devices 1. In addition, such a protective film 26 may not be included in the final product.

In addition, in the manufacturing method according to the present embodiment, the protective film 26 may contain an epoxy resin, and the protective film 26 may be scraped off in the step of removing the protective film 26. By using the epoxy resin for the protective film 26, it is possible to protect the semiconductor elements 10 and the encapsulation material layer 24 from chemicals used in the manufacturing process in addition to protecting the semiconductor elements 10 and the encapsulation material layer 24 from impact.

In addition, the manufacturing method according to the present embodiment further includes a step of removing the protective film 26 and bonding the BSC film 34, which is another protective film, to the second surface of the encapsulation material layer 24*a* on which the re-distribution layer 28 is formed. Therefore, it is possible to provide another protective film after the formation of the re-distribution layer 28 and use the BSC film 34 as it is as the protective layer 12 of the semiconductor device 1 to be manufactured. As a result, it is possible to manufacture the semiconductor device 1 that can protect the semiconductor element 10 even after being manufactured as a product.

In addition, in the manufacturing method according to the present embodiment, the BSC film 34 may contain a curable material, and the storage elastic modulus of the BSC film 34 at 25° C. after being cured may be 300 MPa to 6000 MPa. In this case, the warpage of the entire semiconductor package is suppressed by increasing the rigidity of the package. As a result, singulation and the like can be performed with high accuracy. In addition, it is possible to more reliably protect the semiconductor element 10 in each semiconductor device 1 after singulation. In addition, the storage elastic modulus of the BSC film 34 at 250° C. after being cured may be 0.1 MPa to 200 MPa. In this case, even if the encapsulation body and the like are affected by heat in the manufacturing process, the warpage of the entire semiconductor package can be suppressed. Therefore, singulation and the like can be performed with high accuracy. In addition, even if each semiconductor device 1 after singulation is affected by heat, the semiconductor element 10 can be protected more reliably.

In addition, in the manufacturing method according to the present embodiment, the BSC film 34 may contain a curable material. In the step of bonding the BSC film 34, the BSC film 34 bonded to the encapsulation material layer 24*a* may be cured, and the adhesion strength between the cured BSC film 34 and each of the encapsulation material layer 24*a* and the semiconductor elements 10 may be 1.0 MPa or more. In this case, since the BSC film 34 and each of the encapsulation material layer 24*a* and the semiconductor elements 10 are firmly bonded to each other, the BSC film 34 is prevented from peeling off during singulation or the like. As a result, it is possible to obtain the semiconductor device 1 having the semiconductor element 10 appropriately protected by the BSC film 34. In addition, due to such firm bonding, the semiconductor element 10 in the manufactured semiconductor device 1 can be reliably protected by the BSC film 34 (protective layer 12). The adhesion strength between the cured BSC film 34 and each of the encapsulation material layer 24*a* and the semiconductor elements 10 may be 7.0 MPa or more. In this case, the semiconductor elements 10 are more reliably protected by the BSC film 34. Therefore, a highly reliable semiconductor device can be obtained.

While the embodiment of the present invention has been described in detail above, the present invention is not limited to the above embodiment, and can be applied to various embodiments.

EXAMPLES

Hereinafter, the present invention will be described more specifically with reference to Examples. However, the present invention is not limited to these Examples. In the following Examples, the adhesion strength between the protective film 26 and the encapsulation material layer 24 and the adhesion strength between the protective film 26 and the semiconductor element 1 used in the above semiconductor device manufacturing method according to the embodiment will be described. As for the adhesion strength between the BSC film 34 and the encapsulation material layer 24*a* and the adhesion strength between the BSC film 34 and the semiconductor element 1, the respective adhesion strengths described above can be similarly applied.

Example 1

The following materials were prepared as raw materials for the protective film 26, and these materials were mixed to obtain a protective film.

Figure 6A:
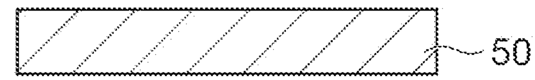
FIGS. 6A to 6D are cross-sectional views showing a method for manufacturing a specimen used in Examples.
Figure 6B:
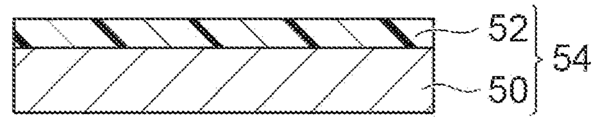

Thermoplastic resin: Acrylic polymer with epoxy group (glass transition temperature: 12° C., weight average molecular weight: 800000) 15 parts by mass Thermosetting resin: YDF-8170C (product name, NIPPON STEEL Chemical & Material Co., Ltd., bisphenol F type liquid epoxy resin, epoxy equivalent 157) 15 parts by mass Thermosetting resin: N-500P-10 (product name, manufactured by DIC Corporation, cresol novolak type epoxy resin) 5 parts by mass Curing agent: PSM-4326 (product name, manufactured by Gun Ei Chemical Industry Co., Ltd., phenolic resin) 15 parts by mass Silica filler: SC2050-HLG (product name, manufactured by ADMATECHS COMPANY LIMITED) 50 parts by mass Light absorber: FP-Black (product name, manufactured by SANYO COLOR WORKS, Ltd., dispersion containing 30% by mass of carbon black) 3 parts by mass Silane coupling agent: A-189 (product name, manufactured by Momentive, (3-mercaptopropyl)trimethoxysilane) 0.1 part by mass Silane coupling agent: A-1160 (product name, manufactured by Momentive, 3-ureidopropyltriethoxysilane) 0.3 parts by mass Curing accelerator: 2PZ-CN (product name, manufactured by SHIKOKU CHEMICALS CORPORATION, 1-cyanoethyl-2-phenylimidazole) 0.05 parts by mass As shown in FIGS. 6A and 6B, the protective film 52 described above was vacuum-laminated on a glass carrier 50 (Eagle XG, manufactured by Hiraoka Special Glass Co., Ltd.) having a thickness of 700 μm and a size of 9×9 $mm^2$ by using a vacuum laminator (product name V-130, manufactured by Nikko-Materials Co., Ltd.). The lamination conditions were as follows. The upper and lower temperatures of the laminator were 90° C. and 40° C., respectively, the pressure of the upper platen was 0.5 MPa, set vacuum pressure was 5.0 hPa, vacuuming time was 20 seconds, top slap time was 0 seconds, and upper pressure time was 60 seconds. As a result, a film laminate 54 in which the protective film 52 having a thickness of 20 μm was formed on one surface of the glass carrier 50 was obtained.

Figure 6C:
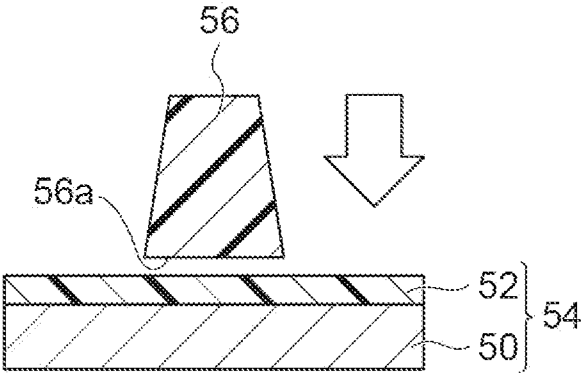

In addition, as shown in FIG. 6C, an encapsulation body 56 formed of an epoxy resin (CEL-400ZHF40, manufactured by Showa Denko Materials Co., Ltd.) was manufactured. The encapsulation body 56 had a trapezoidal cross section and its bottom surface 56*a* had an area of 10 $mm^2$. The bottom surface 56*a* of the encapsulation body 56 was a bonding surface to be bonded to the protective film 52 described above. The encapsulation body 56 was cured.

Figure 6D:
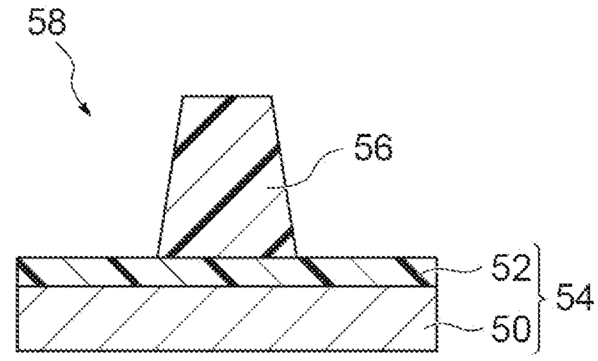
Figure 7:
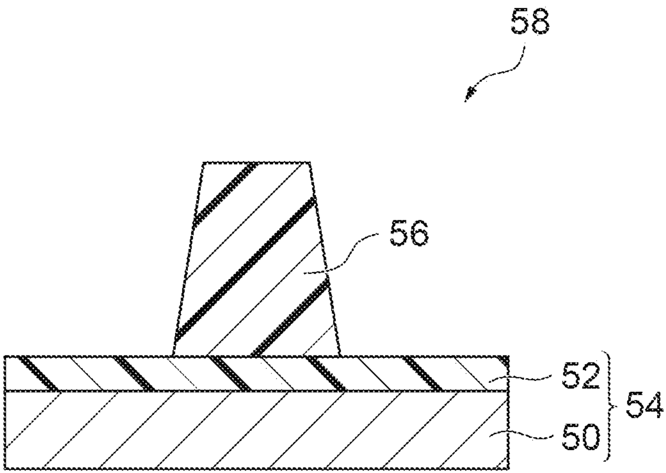
FIG. 7 is a cross-sectional view showing an example of a specimen used in Examples.

Then, as shown in FIGS. 6C and 6D, the encapsulation body was pressed against the protective film 52 of the film laminate 54 described above for 5 seconds with a fixed load by using a push-pull gauge (FB-50N, manufactured by IMADA CO., LTD.), thereby bonding the bottom surface 56*a* of the encapsulation body 56 to the protective film 52. Then, the protective film 52 on the film laminate 54 was cured in this state. Such specimens 58 were prepared as specimens 1 to 6 (see FIG. 7). Table 1 shows the pressing load and curing conditions when each of the specimens 1 to 6 was manufactured. A perfect oven PHH-202 (manufactured by ESPEC CORP.) was used for curing in an air atmosphere, and a high-temperature clean oven CLH-21CD (V)-S (Koyo Thermo Co., Ltd.) was used for curing in a nitrogen ($N_2$) atmosphere.

TABLE 1

| | Pressing load of encapsulation body | Curing conditions |
|---|---|---|
| Specimen 1 | 1N | 30 minutes at 130° C. + 60 minutes at 170° C. (Air) |
| Specimen 2 | 1N | 60 minutes at 170° C. (Air) |
| Specimen 3 | 5N | 30 minutes at 130° C. + 60 minutes at 170° C. (Air) |
| Specimen 4 | 5N | 60 minutes at 170° C. (Air) |
| Specimen 5 | 5N | 60 minutes at 170° C. ($N_2$) |
| Specimen 6 | 5N | 60 minutes at 200° C. ($N_2$) |

Figure 8:
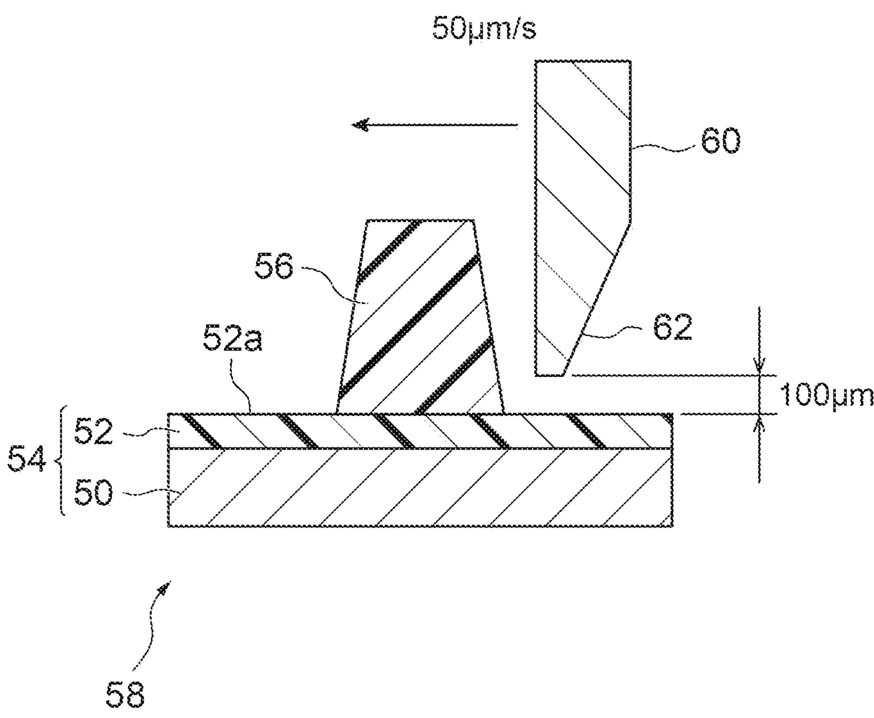
FIG. 8 is a diagram showing a method for measuring the adhesion strength of a specimen in Examples.
Figure 9:
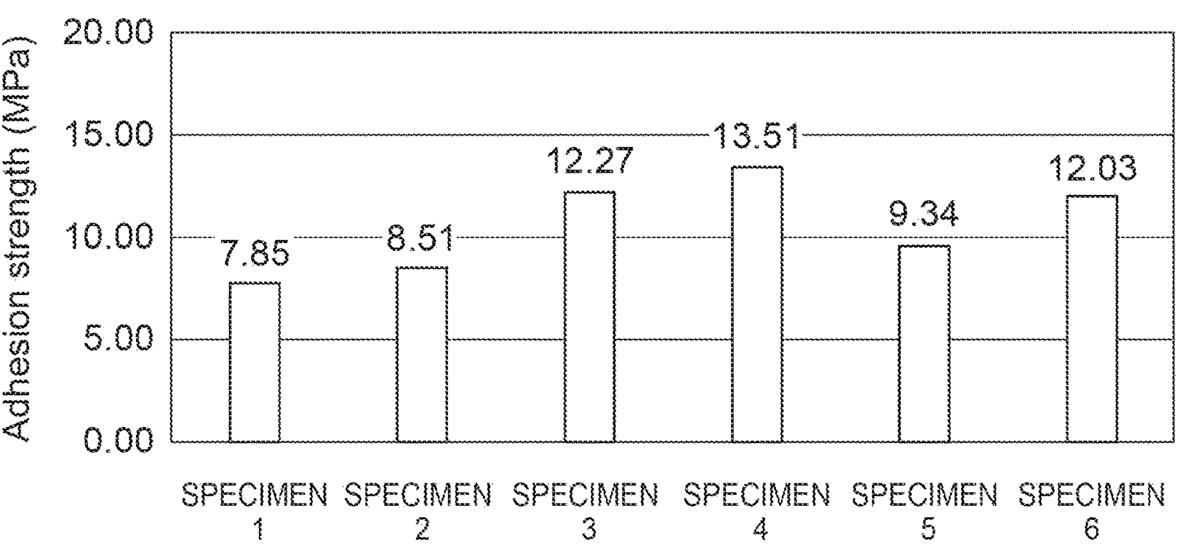
FIG. 9 is a diagram showing an adhesion strength in Example 1.

Then, as shown in FIG. 8, a shear test was performed on the specimens 1 to 6 manufactured under the conditions described above to measure the adhesion strength. For the measurement, System 650 manufactured by ROYCE ins. was used. As for the measurement conditions, as shown in FIG. 8, a probe 60 of the measuring device was set so that a tip 62 of the probe 60 was located 100 μm away from a surface 52*a* of the protective film 52, and the probe 60 was moved at a speed of 50 μm/s to peel off the encapsulation body 56. The force at the time of this peeling was set as the adhesion strength (MPa) between the encapsulation body 56 and the protective film 52. The test was performed with N=10 for each of the specimens 1 to 6, and the results shown in FIG. 9 were obtained. In addition, the average value of the adhesion strengths of the specimens 1 to 6 was calculated. FIG. 9 and Table 2 show the test results. This test was performed at room temperature (25° C.).

TABLE 2

| | Average of adhesion strength (MPa) |
|---|---|
| Specimen 1 | 7.85 |
| Specimen 2 | 8.51 |
| Specimen 3 | 12.27 |
| Specimen 4 | 13.51 |
| Specimen 5 | 9.34 |
| Specimen 6 | 12.03 |

Example 2

Next, in order to test the adhesion strength between the protective film 52 and the semiconductor element, a silicon body having a thickness of 400 μm was pressed against the protective film 52 of the film laminate 54 described above by using the same method as the method shown in FIGS. 6A to 6D, thereby bonding the silicon body to the protective film 52. Then, the protective film 52 on the film laminate 54 was cured in this state. Such a specimen was prepared as a specimen 7. The pressing load and curing conditions for the specimen 7 were the same as for the specimen 1. The bonding area was 10 mm$^2$ as above.

Then, the same shear test as in Example 1 was performed on the specimen 7 manufactured under the conditions described above, and the adhesion strength between the protective film 52 and the silicon body (corresponding to the semiconductor element) was measured. The test was performed with N=10 for the specimen 7, and the average value of the adhesion strengths was obtained. Table 3 shows the test results. This test was performed at room temperature (25° C.).

TABLE 3

| | Average of adhesion strength (MPa) |
|---|---|
| Specimen 7 | 13.59 |

Example 3

Next, the adhesion strength between the protective film 52 and the silicon body was measured under the same conditions as in Example 2 except for the test temperature. The test in this Example 3 was performed at 250° C. That is, the adhesion strength between the protective film 52 and the silicon body at high temperature was measured. Table 4 shows the test results.

TABLE 4

| | Average of adhesion strength (MPa) |
|---|---|
| Specimen 8 | 8.12 |

As shown in Tables 2 to 4 above, it was confirmed that the adhesion strength between the protective film 52 and each of the encapsulation body 56 and the semiconductor element (silicon body) at 25° C. could be set to 1.0 MPa or more and 7.0 MPa or more. In addition, it was confirmed that even in a high-temperature atmosphere, the adhesion strength between the protective film 52 and the semiconductor element (silicon body) could be set to 1.0 MPa or more and 7.0 MPa or more. It was confirmed that, by using a protective film with such an adhesion strength as the protective film 26 or the BSC film 34 in the semiconductor device manufacturing method, it was possible to prevent the semiconductor element or the encapsulation material from being damaged during the manufacture of the semiconductor device, and accordingly, it was possible to provide a highly reliable semiconductor device.

REFERENCE SIGNS LIST

1: semiconductor device, 10: semiconductor element, 10*a*: first surface, 10*b*: second surface, 10*c*: connection terminal, 22: support member, 24: encapsulation material layer (encapsulation body), 24*an* encapsulation material layer (encapsulation body), 26: protective film, 28: re-distribution layer, 30: solder ball, 34: BSC film.

The invention claimed is:

1. A method for manufacturing a semiconductor device, comprising:

preparing a plurality of semiconductor elements each having a first surface on which a connection terminal is formed and a second surface opposite to the first surface;

preparing a support member;

attaching the plurality of semiconductor elements to the support member so that the second surfaces of the plurality of semiconductor elements face the support member;

encapsulating the plurality of semiconductor elements with an encapsulation material;

removing the support member from an encapsulation body in which the plurality of semiconductor elements is encapsulated with the encapsulation material;

bonding a first protective film to a second surface of the encapsulation body located on the second surface side of the plurality of semiconductor elements;

forming a re-distribution layer on a first surface of the encapsulation body located on the first surface side of the plurality of semiconductor elements after bonding the first protective film to the encapsulation body;

removing the first protective film after the forming of the re-distribution layer;

bonding a second protective film to the second surface of the encapsulation body, wherein the re-distribution layer is formed on the first surface of the encapsulation body; and singulating into individual semiconductor devices corresponding to the plurality of semiconductor elements after bonding the second protective film to the second surface of the encapsulation body.

2. The method for manufacturing a semiconductor device according to claim 1, wherein the first protective film contains a curable material, and a storage elastic modulus of the first protective film at 25° C. after being cured is 300 MPa to 6000 MPa.

3. The method for manufacturing a semiconductor device according to claim 2, wherein the storage elastic modulus of the first protective film at 250° C. after being cured is 0.1 MPa to 200 MPa.

4. The method for manufacturing a semiconductor device according to claim 1, wherein the first protective film contains a curable material, wherein, in the bonding of the first protective film, the first protective film bonded to the second surface of the encapsulation body is cured, and an adhesion strength between the cured first protective film and the encapsulation body is 1.0 MPa or more.

5. The method for manufacturing a semiconductor device according to claim 1, wherein the first protective film contains a curable material, wherein, in the bonding of the first protective film, the first protective film bonded to the second surface of the encapsulation body is cured, and an adhesion strength between the cured first protective film and the plurality of semiconductor elements is 1.0 MPa or more.

6. The method for manufacturing a semiconductor device according to claim 1, further comprising:

forming a solder ball on the re-distribution layer, wherein the first protective film is removed after the forming of the solder ball.

7. The method for manufacturing a semiconductor device according to claim 1, wherein the first protective film contains an epoxy resin, and wherein, in the removing of the first protective film, the protective film is scraped off.

8. The method for manufacturing a semiconductor device according to claim 1, wherein the second protective film contains a curable material, and a storage elastic modulus of the second protective film at 25° C. after being cured is 300 MPa to 6000 MPa.

9. The method for manufacturing a semiconductor device according to claim 8, wherein the storage elastic modulus of the second protective film at 250° C. after being cured is 0.1 MPa to 200 MPa.

10. The method for manufacturing a semiconductor device according to claim 1, wherein the second protective film contains a curable material, and wherein, in the bonding of the second protective film, the second protective film bonded to the second surface of the encapsulation body is cured, and an adhesion strength between the cured second protective film and the encapsulation body is 1.0 MPa or more.

11. The method for manufacturing a semiconductor device according to claim 10, wherein an adhesion strength between the cured second protective film and the encapsulation body is 7.0 MPa or more.

12. The method for manufacturing a semiconductor device according to claim 1, wherein the second protective film contains a curable material, and wherein, in the bonding of the second protective film, the second protective film bonded to the second surface of the encapsulation body is cured, and an adhesion strength between the cured second protective film and the plurality of semiconductor elements is 1.0 MPa or more.

13. The method for manufacturing a semiconductor device according to claim 12, wherein an adhesion strength between the cured second protective film and the plurality of semiconductor elements is 7.0 MPa or more.

14. The method for manufacturing a semiconductor device according to claim 1, wherein the first protective film and the second protective film are formed as the same type of protective films.

15. A method for manufacturing a semiconductor device, comprising:

preparing a plurality of semiconductor elements each having a first surface on which a connection terminal is formed and a second surface opposite to the first surface;

preparing a support member;

attaching the plurality of semiconductor elements to the support member so that the second surfaces of the plurality of semiconductor elements face the support member;

encapsulating the plurality of semiconductor elements with an encapsulation material;

removing the support member from an encapsulation body in which the plurality of semiconductor elements is encapsulated with the encapsulation material;

bonding a first protective film to a second surface of the encapsulation body located on the second surface side of the plurality of semiconductor elements;

forming a re-distribution layer on a first surface of the encapsulation body located on the first surface side of the plurality of semiconductor elements after bonding the first protective film to the encapsulation body;

removing the first protective film after the forming of the re-distribution layer; and bonding a second protective film to the second surface of the encapsulation body, wherein the re-distribution layer is formed on the first surface of the encapsulation body;

wherein the second protective film contains a curable material, and wherein, in the bonding of the second protective film, the second protective film bonded to the second surface of the encapsulation body is cured, and an adhesion strength between the cured second protective film and the encapsulation body is 1.0 MPa or more.

16. The method for manufacturing a semiconductor device according to claim 15, wherein an adhesion strength between the cured second protective film and the encapsulation body is 7.0 MPa or more.

17. The method for manufacturing a semiconductor device according to claim 15, wherein an adhesion strength between the cured second protective film and the plurality of semiconductor elements is 1.0 MPa or more.

18. A method for manufacturing a semiconductor device, comprising:

preparing a plurality of semiconductor elements each having a first surface on which a connection terminal is formed and a second surface opposite to the first surface;

preparing a support member;

attaching the plurality of semiconductor elements to the support member so that the second surfaces of the plurality of semiconductor elements face the support member;

encapsulating the plurality of semiconductor elements with an encapsulation material;

removing the support member from an encapsulation body in which the plurality of semiconductor elements is encapsulated with the encapsulation material;

bonding a first protective film to a second surface of the encapsulation body located on the second surface side of the plurality of semiconductor elements;

forming a re-distribution layer on a first surface of the encapsulation body located on the first surface side of the plurality of semiconductor elements after bonding the first protective film to the encapsulation body;

removing the first protective film after the forming of the re-distribution layer; and bonding a second protective film to the second surface of the encapsulation body, wherein the re-distribution layer is formed on the first surface of the encapsulation body;

wherein the second protective film contains a curable material, and wherein, in the bonding of the second protective film, the second protective film bonded to the second surface of the encapsulation body is cured, and an adhesion strength between the cured second protective film and the plurality of semiconductor elements is 1.0 MPa or more.

* * * * *